(12) United States Patent
Horng

(10) Patent No.: US 7,679,935 B2
(45) Date of Patent: Mar. 16, 2010

(54) ELECTROMAGNETIC-SHIELDING DEVICE

(76) Inventor: Chin-Fu Horng, 4F, No. 282, Chung San First Rd., Lu Chou City, Taipei Hsien (TW)

( * ) Notice: Subject to any disclaimer, the term of this patent is extended or adjusted under 35 U.S.C. 154(b) by 97 days.

(21) Appl. No.: 11/812,034

(22) Filed: Jun. 14, 2007

(65) Prior Publication Data

US 2008/0247147 A1 Oct. 9, 2008

(30) Foreign Application Priority Data

Apr. 3, 2007 (TW) .............................. 96205423 U

(51) Int. Cl.
*H05K 9/00* (2006.01)
(52) U.S. Cl. .................. 361/818; 361/816; 361/800; 361/799; 361/753; 174/350; 174/377
(58) Field of Classification Search .......... 361/800, 361/818, 816, 753, 799; 174/354, 374, 384, 174/377, 350
See application file for complete search history.

(56) References Cited

U.S. PATENT DOCUMENTS

| | | | | |
|---|---|---|---|---|
| 5,095,177 A | * | 3/1992 | Johnson ..................... | 174/372 |
| 5,353,201 A | * | 10/1994 | Maeda ....................... | 361/816 |
| 5,354,951 A | * | 10/1994 | Lange et al. ................ | 174/372 |
| 5,436,802 A | * | 7/1995 | Trahan et al. ............... | 361/816 |
| 5,917,708 A | * | 6/1999 | Moran et al. ................ | 361/800 |
| 5,999,067 A | * | 12/1999 | D'Ostilio ................... | 333/185 |
| 6,175,077 B1 | * | 1/2001 | Mendolia et al. ........... | 174/384 |
| 6,181,573 B1 | * | 1/2001 | Riet ............................ | 361/816 |
| 6,269,008 B1 | * | 7/2001 | Hsu ........................... | 361/816 |
| 6,320,121 B1 | * | 11/2001 | Honeycutt et al. ......... | 174/384 |
| 6,323,418 B1 | * | 11/2001 | Tiburtius et al. ........... | 174/387 |
| 6,377,472 B1 | * | 4/2002 | Fan ............................ | 361/800 |
| 6,549,426 B1 | * | 4/2003 | Lawlyes et al. ............ | 361/816 |
| 6,570,086 B1 | * | 5/2003 | Shimoji et al. ............. | 174/377 |
| 6,590,783 B2 | * | 7/2003 | Spratte et al. .............. | 361/800 |
| 6,787,695 B2 | * | 9/2004 | Martin et al. .............. | 174/384 |
| 6,870,091 B2 | * | 3/2005 | Seidler ...................... | 174/382 |

* cited by examiner

*Primary Examiner*—Dameon E Levi
(74) *Attorney, Agent, or Firm*—Birch, Stewart, Kolasch & Birch, LLP

(57) ABSTRACT

An electromagnetic-shielding device disposed in an electronic device prevents that an electric component in the electronic device is interfered by electromagnetic wave. The electromagnetic-shielding device has at least one positioning and leaning wall, which is mounted on a laminate member as a part of a housing of the electronic device or a central plate within the electronic device. By means of the positioning and leaning wall, an electromagnetic-shielding mask is conveniently mounted within the electronic device so as to cover the electronic component.

14 Claims, 4 Drawing Sheets

ELECTROMAGNETIC-SHIELDING DEVICE

BACKGROUND OF THE INVENTION

1. Field of the Invention

The present invention generally relates to an electromagnetic-shielding device, more particular to an electromagnetic-shielding device, which employs a laminate member and four positioning and leaning walls in order to let an electromagnetic-shielding mask be easily and precisely covered an electric component in an electronic device.

2. Description of the Prior Art

For avoiding the electric components as CPUs, chips, etc. of the PCBs in a mobile phone, PDA, laptop, etc. being not interfered by outside EMI (electromagnetic interference), the components just can work properly. On the other hand, the EMI leaking from some powered electric components should also be shielded to not bother other outside electronic devices and organisms.

An electromagnetic-shielding mask in prior arts is mounted on PCB and covers electric components. Such electromagnetic mask is mounted on PCB by the ways of welding, fastening, etc. in order to shield EMI.

However, if the way of welding, such as SMT, is adopted, the materials for welding and applying are then limited. Further, the procedures are complicate and the cost of materials is relatively higher. On the other hand, the electromagnetic-shielding mask is not easily dismantled while in maintenance.

Besides, another prior art is that of installing an electromagnetic-shielding mask on a central plate of a housing or an electronic device. Please refer to FIG. 1, which illustrates a schematic view of an electromagnetic-shielding mask 2 installing on a housing 4 in prior arts. For the prior art, a plurality of holes 6 is formed on the bottom plate of the electromagnetic-shielding mask 2 in an electronic device 20, and the bottom plate is adhered to the inner surface of the housing 4 through the way of using hot melt adhesive and the plurality of holes 6.

However, the electromagnetic-shielding mask 2 is hardly positioned while adhering the electromagnetic-shielding mask 2 to the housing 4. Since some movement is randomly made, the electromagnetic-shielding mask 2 cannot precisely be covered an electric component 12 of a PCB 10 while installing the housing 4; additionally, the installment is hardly finished.

Therefore, how to provide an advanced structure for the electromagnetic-shielding mask and the housing to be simply and effectively installed on is an important issue to the skilled people.

SUMMARY OF THE INVENTION

The primary objective of the present invention is to provide an electromagnetic-shielding device, which employs a housing or a central plate and at least one positioning and leaning wall in order to let an electromagnetic-shielding mask be easily and precisely covered an electric component in an electronic device. So that the assembling accuracy is promoted and the error possibility is decreased.

The secondary objective of the present invention is to provide an electromagnetic-shielding device, which structure can be made easily so as to save the cost, including material and labor.

The present invention discloses an electromagnetic-shielding device, which comprises at least one positioning and leaning wall and at least one electromagnetic-shielding mask and is disposed in an electronic device to protect that an electric component is not interfered by electromagnetic wave. A laminate member is disposed within the electronic device and can be a part of the electronic device or a central plate within the electronic device.

The positioning and leaning wall is fixed on the laminate member and elongated toward the electric component. Each side surface of the electromagnetic-shielding mask is traverse leaned on the positioning and leaning wall, and the bottom surface of the electromagnetic-shielding mask is longitudinally leaned on the laminate member, thus the electromagnetic-shielding mask is positioned and covered the electric component.

Wherein the electromagnetic-shielding mask is backward and longitudinally adhered to the laminate member by way of glue, hot melt adhesive, twin adhesive, laser welding, laser spot welding, etc.

The electromagnetic-shielding device of the present invention can avoid that the electric component in the electronic device is interfered by electromagnetic wave. The positioning and leaning wall functions to help that the electromagnetic-shielding mask is accurately mounted on the housing or the central plate in order to promote the precision of assembling the electronic device and decrease the possibility of generating errors. The electromagnetic-shielding device can be constructed very easily due to its simple structure. Further more, mounting the electromagnetic-shielding device lets a conductive sponge be no more existed. Therefore, the material cost for avoiding electromagnetic interference can be highly decreased.

Other and further features, advantages, and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits, and advantages of the preferred embodiments of the present invention will be readily understood by the accompanying drawings and detailed descriptions, wherein.

DETAILED DESCRIPTION OF THE INVENTION

Figure 1:
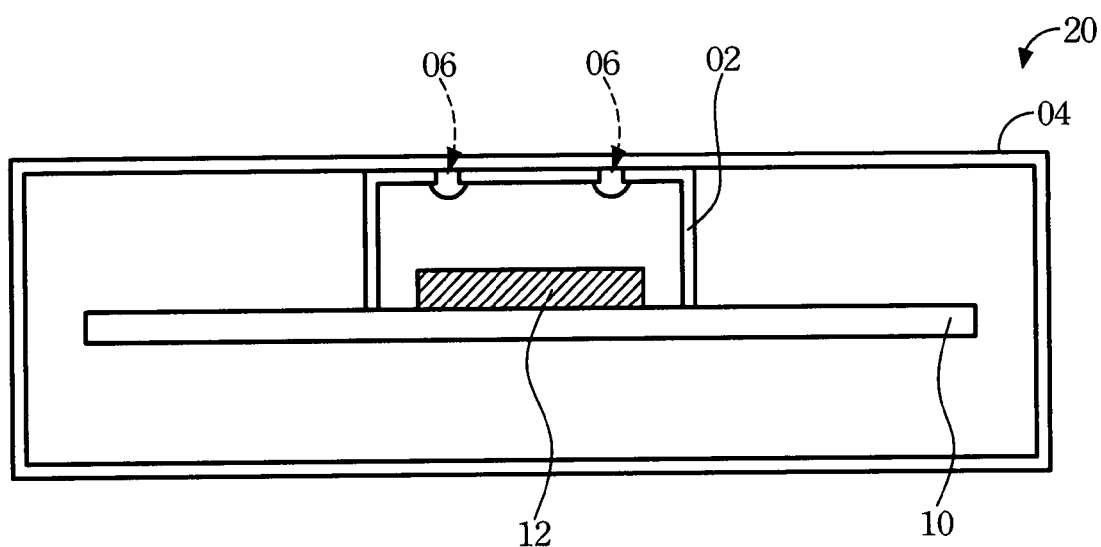
FIG. 1 illustrates a schematic view of an electromagnetic-shielding mask installing on a housing in prior arts.
Figure 2:
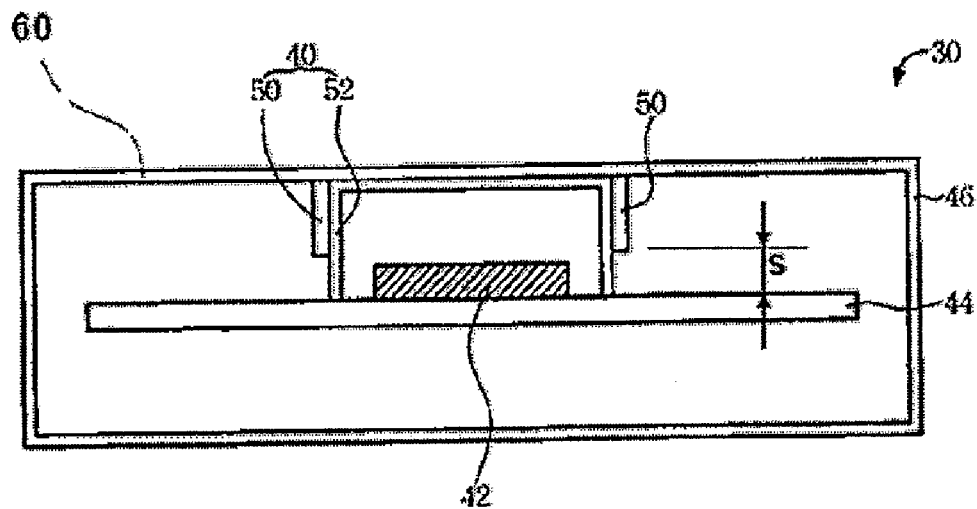
FIG. 2 illustrates a schematic side sectional view of an electromagnetic-shielding device of the present invention.

With reference to FIG. 2, which illustrates a schematic side sectional view of an electromagnetic-shielding device 40 of the present invention. The electromagnetic-shielding device 40 is disposed in an electronic device 30 to avoid that an electric component 42 in the electronic device 30 is interfered by electromagnetic wave, in which the electric component 42 is normally disposed in a PCB 44. A laminate member 60 is defined inside the electronic device 30. As shown in FIG. 2, the laminate member 60 is a part of a housing 46 of the electronic device 30.

The electromagnetic-shielding device 40 including a positioning and leaning wall 50 and an electromagnetic-shielding mask 52. In practice, the positioning and leaning wall 50 may be more than one. There are two positioning and leaning walls 50 disposed at both sides respectively in FIG. 2. Each positioning and leaning wall 50 is fixed on the laminate member 60 and elongated toward the electric component 42. Each side surface of the electromagnetic-shielding mask 52 is traverse leaned on each positioning and leaning wall 50, the bottom surface of the electromagnetic-shielding mask 52 is longitudinally leaned on the laminate member 60, and thus the electromagnetic-shielding mask 52 is positioned and covers the electric component 42.

Wherein the electromagnetic-shielding mask is backward and longitudinally adhered to the laminate member 60 by way of glue, hot melt adhesive, twin adhesive, laser welding, laser spot welding, etc. Also, in the present invention, the tip end of each positioning and leaning wall 50 is distanced to the PCB 44 by a predetermined spacing s.

Figure 3:
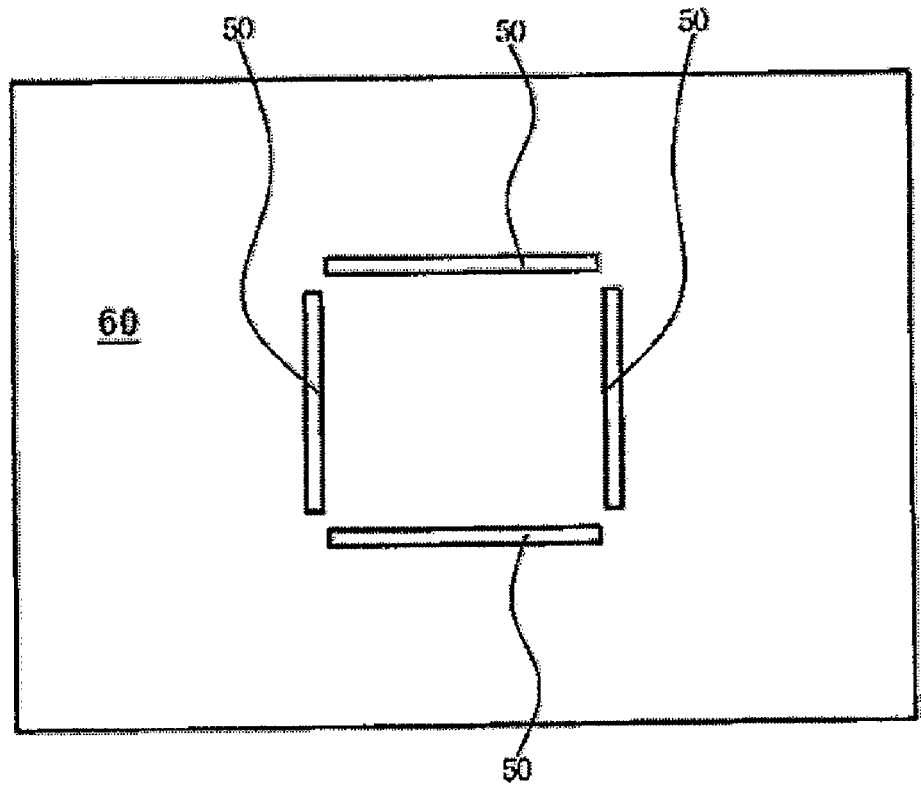
FIG. 3 illustrates a schematic top view of a first preferred embodiment of a positioning and leaning wall of the present invention.

With reference to FIG. 3, which illustrates a schematic top view of a first preferred embodiment of the positioning and leaning wall 50 of the present invention. The positioning and leaning wall 50 may not be limited in an aspect of shape. As shown in FIG. 3, each positioning and leaning wall 50 is shaped as a rectangular laminate and corresponds to each side surface of the electromagnetic-shielding mask. Thereby, the four positioning and leaning walls 50 provide an excellent fixing function to the electromagnetic-shielding mask 52.

Figure 4:
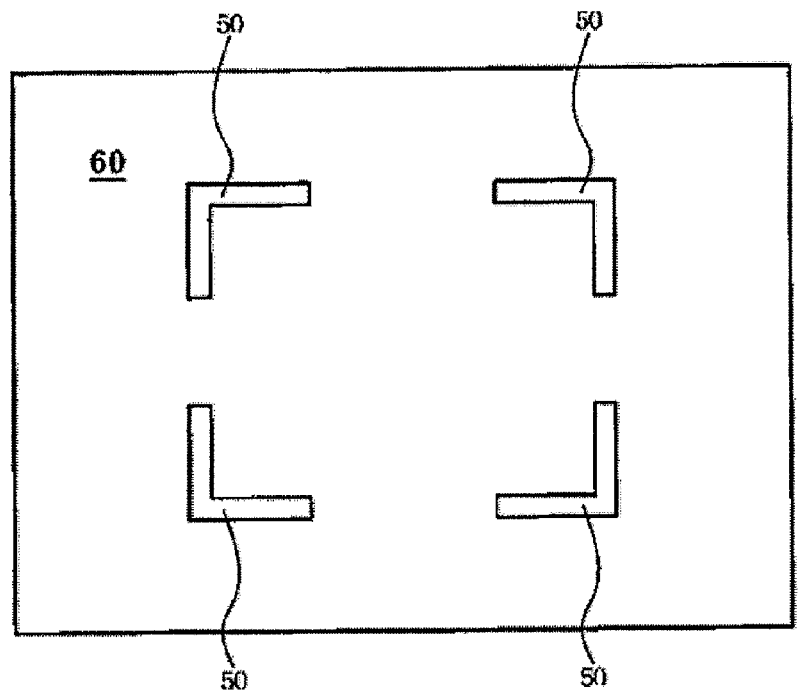
FIG. 4 illustrates a schematic top view of a second preferred embodiment of the positioning and leaning wall of the present invention.

Besides, with reference to FIG. 4, which illustrates a schematic top view of a second preferred embodiment of the positioning and leaning wall 50 of the present invention. As shown in FIG. 4, each positioning and leaning wall 50 is shaped as an L-type laminate and corresponds to each corner of the electromagnetic-shielding mask 52. Thereby, the four positioning and leaning walls 50 provide an excellent fixing function to the electromagnetic-shielding mask 52. In practice, such L-type laminate provides better effect of fixing, and even one L-type laminate can offer 2-dimensional position.

Figure 5:
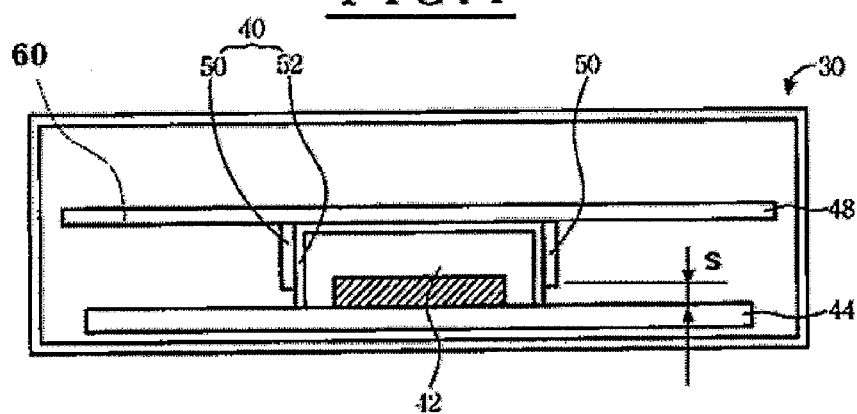
FIG. 5 illustrates a schematic sectional view of another preferred embodiment of a laminate member of the present invention.

With reference to FIG. 5, which illustrates a schematic sectional view of another preferred embodiment of the laminate member of the present invention. As shown in FIG. 2, the laminate member 60 is a part of a housing 46 of the electronic device 30; on the other hand, the laminate member 60 can be any member within the electronic device 30. Further referring to FIG. 5, the laminate member 60 is defined as a central plate 48 in the electronic device 30.

The central plate 48 divides the electronic device 30 into two spaces, which are an upper space and a lower space. A PCB 44 is located in the lower space, and the electric component 42 is disposed on the upper surface of the PCB 44. Hence, the electromagnetic-shielding device 40 is disposed on the lower surface of the central plate 48 so as to protecting the electric component 42.

Figure 6:
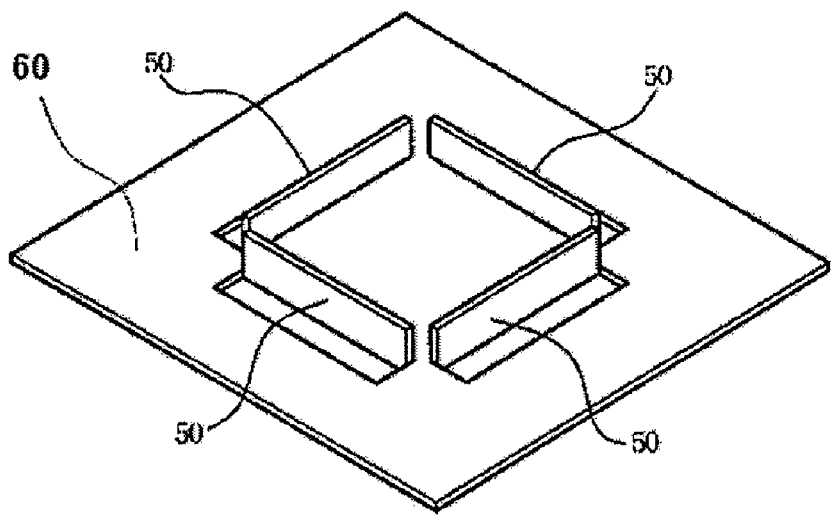
FIG. 6 illustrates a schematic view of the positioning and leaning wall made by metal of the present invention.

With reference to FIG. 6, which illustrates a schematic view of the positioning and leaning wall 50 made by metal of the present invention. The material to the positioning and leaning wall 50 is the same as the material to the laminate member 60, that is, the manufacturing processes may be simplified. If the laminate member 60, either the housing 46 or the central plate 48, is made of metal, and can then be punched to form the positioning and leaning wall 50.

Figure 7:
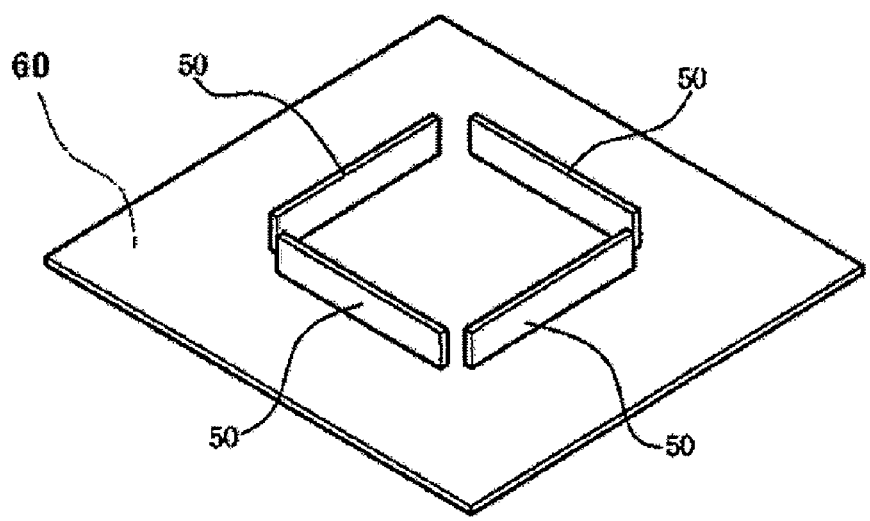
FIG. 7 illustrates a schematic view of the positioning and leaning wall made by plastic of the present invention.

With the reference to FIG. 7, which illustrates a schematic view of the positioning and leaning wall 50 made by plastic of the present invention. If the laminate member 60 is made by plastic, that is, the housing 46 or the central plate 48 is made by plastic, thereby the positioning and leaning wall 50 with plastic material can be integrated with the laminate member while in manufacturing. So that to form the positioning and leaning wall 50 may be saving cost.

As a conclusion, the electromagnetic-shielding device 40 of the present invention can avoid that the electric component 42 in the electronic device 30 is interfered by electromagnetic wave. The positioning and leaning wall 50 functions to help that the electromagnetic-shielding mask 52 is accurately mounted on the housing 46 or the central plate 48 in order to promote the precision of assembling the electronic device 30 and decrease the possibility of generating errors. The electromagnetic-shielding device 40 can be constructed very easily due to its simple structure. Further more, mounting the electromagnetic-shielding device 40 lets a conductive sponge be no more existed. Therefore, the material cost for avoiding electromagnetic interference can be highly decreased.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. An electromagnetic-shielding device disposed in an electronic device to avoid that an electric component in the electronic device is interfered by electromagnetic wave, comprising:
 a printed circuit board (PCB) located inside the electronic device to mount the electronic component thereon;
 a laminate member located inside the electronic device and above the PCB and the electronic component;
 at least one positioning and leaning wall, which is mounted and connected to the laminate member and elongated toward the electric component from the laminate member, a tip end of the positioning and leaning wall being distanced to the PCB by a predetermined spacing; and
 an electromagnetic-shielding mask, located between the PCB and the laminate member to position and cover the electric component on the PCB, fixed to the laminate member by the positioning and leaning wall.

2. The electromagnetic-shielding device according to claim 1, wherein the positioning and leaning wall is the shape of rectangular laminate.

3. The electromagnetic-shielding device according to claim 1, wherein the positioning and leaning wall is the shape of L-type laminate.

4. The electromagnetic-shielding device according to claim 1, wherein the electromagnetic-shielding mask is backward and longitudinally adhered to the laminate member by way of glue.

5. The electromagnetic-shielding device according to claim 1, wherein the electromagnetic-shielding mask is longitudinally adhered to the laminate member by way of hot melt adhesive.

6. The electromagnetic-shielding device according to claim 1, wherein the electromagnetic-shielding mask is longitudinally adhered to the laminate member by way of twin adhesive.

7. The electromagnetic-shielding device according to claim 1, wherein the electromagnetic-shielding mask is longitudinally adhered to the laminate member by way of laser welding.

8. The electromagnetic-shielding device according to claim 1, wherein the electromagnetic-shielding mask is longitudinally adhered to the laminate member by way of laser spot welding.

9. The electromagnetic-shielding device according to claim 1, wherein the laminate member is defined as a part of the electronic device.

10. The electromagnetic-shielding device according to claim 1, wherein the laminate member is defined as a central plate within the electronic device.

11. The electromagnetic-shielding device according to claim 1, wherein the positioning and leaning wall is made of plastic.

12. The electromagnetic-shielding device according to claim 1, wherein the laminate member is made of plastic and integrated with the positioning and leaning wall.

13. The electromagnetic-shielding device according to claim 1, wherein the positioning and leaning wall is made of metal.

14. The electromagnetic-shielding device according to claim 13, wherein the laminate member is made of metal, and the positioning and leaning wall is made by way of punching the laminate member.

* * * * *